United States Patent
Chen et al.

(10) Patent No.: US 10,110,402 B2
(45) Date of Patent: Oct. 23, 2018

(54) PAM4 SIGNAL GENERATION APPARATUS

(71) Applicant: HISILICON OPTOELECTRONICS CO., LIMITED, Wuhan (CN)

(72) Inventors: Hongmin Chen, Santa Clara, CA (US); Zhenwei Cui, Wuhan (CN); Xi Huang, Wuhan (CN)

(73) Assignee: Hisilicon Optoelectronics Co., Limited, Wuhan (CN)

( * ) Notice: Subject to any disclaimer, the term of this patent is extended or adjusted under 35 U.S.C. 154(b) by 0 days.

(21) Appl. No.: 15/857,453

(22) Filed: Dec. 28, 2017

(65) Prior Publication Data

US 2018/0191536 A1    Jul. 5, 2018

(30) Foreign Application Priority Data

Dec. 29, 2016    (CN) .......................... 2016 1 1245799

(51) Int. Cl.
*H04L 25/34* (2006.01)
*H04L 25/49* (2006.01)
(Continued)

(52) U.S. Cl.
CPC .......... *H04L 25/4917* (2013.01); *H03K 7/02* (2013.01); *H04L 1/0003* (2013.01); *H04L 1/0063* (2013.01); *H04L 27/0008* (2013.01)

(58) Field of Classification Search
USPC ......................................... 375/286, 373, 327
See application file for complete search history.

(56) References Cited

U.S. PATENT DOCUMENTS 7,483,597 B2    1/2009  Shastri et al.
8,983,291 B1    3/2015  Broekaert et al.
(Continued)

FOREIGN PATENT DOCUMENTS

| WO | 2011090575 A2 | 7/2011 |
| WO | 2014130386 A1 | 8/2014 |
| WO | 2016041163 A1 | 3/2016 |

OTHER PUBLICATIONS

Patel et al. "Silicon Photonic Segmented Modulator-Based Electro-Optic DAC for 100 Gb/s PAM-4 Generation," IEEE Photonics Technology Letters, vol. 27, No. 23, pp. 2433-2436, Institute of Electrical and Electronics Engineers, New York, New York (Dec. 2015).

*Primary Examiner* — Wednel Cadeau
(74) *Attorney, Agent, or Firm* — Leydig, Voit & Mayer, Ltd.

(57) ABSTRACT

A PAM4 signal generation apparatus is provided. The PAM4 signal generation apparatus includes a DFB, two EA modulators, an SOA, a PSR, a direct-current power source, two electrical-signal generators, and two amplitude-limiting amplifiers. The two electrical-signal generators and the two amplitude-limiting amplifiers are used to generate two NRZ electrical signals respectively, the DFB outputs two optical signals, the SOA amplifies an optical power of one of the optical signals, the two EA modulators use the NRZ electrical signals and the optical signals including "a large signal and a small signal" respectively to generate two NRZ optical signals respectively, and the two NRZ optical signals are multiplexed by the PSR to generate a PAM4 electrical signal. According to this apparatus, a linearity requirement is greatly lowered. PAM4 modulation is performed in an optical domain, and this prevents a PAM4 signal from being generated on an electrical signal.

12 Claims, 2 Drawing Sheets

(51) Int. Cl.
*H03K 7/02* (2006.01)
*H04L 1/00* (2006.01)
*H04L 27/00* (2006.01)

(56) References Cited

U.S. PATENT DOCUMENTS

| | | | |
|---|---|---|---|
| 2004/0067006 A1* | 4/2004 | Welch | B82Y 20/00 |
| | | | 385/14 |
| 2007/0041735 A1* | 2/2007 | Darcie | H04B 10/032 |
| | | | 398/186 |
| 2009/0279576 A1 | 11/2009 | Joyner et al. | |
| 2014/0133868 A1 | 5/2014 | Krause et al. | |
| 2014/0133870 A1 | 5/2014 | Lee et al. | |
| 2015/0132013 A1 | 5/2015 | Vermeulen | |
| 2015/0341123 A1 | 11/2015 | Nagarajan | |
| 2016/0119057 A1 | 4/2016 | Mekis et al. | |
| 2017/0195058 A1 | 7/2017 | Wang et al. | |

* cited by examiner

PAM4 SIGNAL GENERATION APPARATUS

CROSS-REFERENCE TO RELATED APPLICATION

This application claims priority to Chinese Patent Application No. 201611245799.6, filed on Dec. 29, 2016, which is hereby incorporated by reference in its entirety.

TECHNICAL FIELD

The present disclosure relates to the field of optical communications technologies, and in particular, to a PAM4 signal generation apparatus.

BACKGROUND

With rapid development of the customer-side short-distance interconnection field in recent years, an increasingly high requirement is raised for a system capacity, and a pure non-return-to-zero code (NRZ) system cannot meet a requirement. A format of a four-level pulse amplitude modulation (PAM4) code gains increasingly more attention. The PAM4 code is a solution to 200 G/400 G communication within 500 meters (m) to 10 kilometers (km) or even to 40 km. A current research on PAM4 has evolved from a standard stage to a practical stage, and many manufacturers are developing high-performance PAM4 chips and devices.

The PAM4 code includes four levels, and a quantity of levels of the PAM4 code is doubled relative to that of an NRZ signal. Therefore, a requirement on device linearity is increased. In an actual application, the four levels need to be evenly distributed to achieve optimal judgment. Therefore, a requirement on device linearity is relatively high. In addition, a baud rate of a PAM4 signal is decreased by a half relative to that of a binary on-off keying (OOK) signal in a case of a same bit rate, thereby reducing a requirement on a bandwidth of a device. Relative to a coherent system, the PAM4 code does not need a complex coding/decoding algorithm or a decorrelation algorithm, bringing remarkable advantages in power consumption and costs.

In the prior art, there are two main PAM4 signal generation technologies.

I. A PAM4 signal generation method based on an electro-absorption modulated laser (EML): Currently, a PAM4 generation device based on a single-ended EML is relatively common; in this case, the EML may be integrated in a transmitter optical subassembly (TOSA), and a current mainstream technology is to generate a PAM4 signal based on an EML, for example, a 25 GHz EML is used to generate a PAM4 signal with 26.56 Gbauds. However, the PAM4 raises a relatively high linearity requirement for a system. Therefore, a device of higher linearity generally obtains a PAM4 signal of higher quality. However, it is not quite easy to design a high-linearity TOSA device.

From a perspective of a working principle of a single-ended EML, a cut-off area is formed in an area of a relatively low voltage, and an absorption coefficient of an electro-absorption (EA) modulator of the EML no longer changes with a reduction in a voltage. A saturation area is formed in an area of a relatively high voltage, and similarly, an absorption coefficient of the EA modulator no longer changes with an increase in a voltage. This characteristic of the EML is quite conducive to an NRZ signal modulation code, may inhibit a level 0 and a level 1 of an NRZ signal, and is conducive to improving NRZ signal quality. However, this characteristic is quite detrimental to the PAM4 signal because the PAM4 signal is generated in a linear area of a modulation curve. It is quite difficult to form a relatively good linear area due to impact of the characteristic of the single-ended EML itself. Therefore, it is quite difficult for the single-ended EML to generate a high-quality PAM4 signal.

In addition, for a radio frequency amplifier that drives the EML, if a PAM4 electrical signal is directly used to drive the EML to generate a PAM4 optical signal, a quite high linearity requirement is raised for an electrical device required in this solution, and as a modulation rate increases, an increasingly high requirement is raised for an optical device and an electrical device that are required for PAM4 signal modulation.

II. A PAM4 signal generation method based on a directly modulated laser (DML): Linearity of the DML is superior to that of an EML, but this does not mean that a PAM4 signal generated based on the DML is of quite good performance because the DML-based PAM4 signal has a performance loss in another aspect. For example: 1. A difference between characteristics of high and low temperatures: Because there is no temperature control unit in the DML, the characteristics of the high and low temperatures are deteriorated quite severely. In a case of a high temperature, not only a bandwidth of the device is quickly degraded, but also linearity is degraded, exerting relatively great impact on performance. Even if there is a DML device with a temperature control unit, a bandwidth of the DML device is still a bottleneck in an engineering application. 2. A chirp effect: Because the DML directly adjusts a current, a chirp effect may be accompanied in a signal modulation process. This is detrimental to a long-distance application scenario. In addition, the chirp effect of the laser and a chromatic dispersion effect of an optical fiber interact with each other, causing relatively high chromatic dispersion. 3. Currently, it is relatively difficult to design a high-linearity driver for the DML. Therefore, a high-quality PAM4 signal cannot be generated based on the DML.

It can be known from the foregoing that, in the prior art, the single-ended EML cannot generate a PAM4 signal of relatively high quality due to a linearity limitation, and the single-ended DML cannot generate a PAM4 signal of relatively high quality either due to impact of the characteristics of the high and low temperatures and a noise characteristic that are of the single-ended DML device.

SUMMARY

Embodiments of the present disclosure provide a PAM4 signal generation apparatus, to generate a high-quality PAM4 signal.

To achieve the foregoing technical effect, the embodiments of the present disclosure provide the following technical solutions.

An embodiment of the present disclosure provides a PAM4 signal generation apparatus, where the PAM4 signal generation apparatus includes a distributed feedback laser (DFB), a first electro-absorption (EA) modulator, a second EA modulator, a semiconductor optical amplifier (SOA), a polarization beam splitting rotator (PSR), a first electrical-signal generator, a first amplitude-limiting amplifier, a second electrical-signal generator, a second amplitude-limiting amplifier, a first direct-current power source, and a second direct-current power source; an input port of the DFB is connected to the first direct-current power source, and the DFB is connected to both the first EA modulator and the SOA by using two output ports; the first EA modulator is connected to both the first amplitude-limiting amplifier and the DFB by using two input ports, and an output port of the first EA modulator is connected to the PSR; the SOA is connected to both the DFB and the second direct-current power source by using two input ports, and an output port of the SOA is connected to the second EA modulator; the second EA modulator is connected to both the second amplitude-limiting amplifier and the SOA by using two input ports, and an output port of the second EA modulator is connected to the PSR; the PSR is connected to both the first EA modulator and the second EA modulator by using two input ports; the first electrical-signal generator is connected to the first amplitude-limiting amplifier, and the second electrical-signal generator is connected to the second amplitude-limiting amplifier; the DFB is configured to: receive a first direct-current bias signal input by the first direct-current power source, generate a first optical signal and a second optical signal according to the first direct-current bias signal separately, transmit the first optical signal to the first EA modulator, and transmit the second optical signal to the SOA, where the first optical signal and the second optical signal have a same wavelength; the first EA modulator is configured to: receive a first non-return-to-zero NRZ electrical signal input by the first electrical-signal generator by using the first amplitude-limiting amplifier, receive the first optical signal input by the DFB, obtain a first NRZ optical signal by means of modulation according to the first NRZ electrical signal and the first optical signal, and transmit the first NRZ optical signal to the PSR; the SOA is configured to: receive a second direct-current bias signal input by the second direct-current power source, receive the second optical signal input by the DFB, adjust an optical power of the second optical signal according to the second direct-current bias signal to obtain a second optical signal that is after optical power amplification, and transmit, to the second EA modulator, the second optical signal that is after optical power amplification; the second EA modulator is configured to: receive a second NRZ electrical signal input by the second electrical-signal generator by using the second amplitude-limiting amplifier, receive the second optical signal that is after optical power amplification and that is input by the SOA, obtain a second NRZ optical signal by means of modulation according to the second NRZ electrical signal and the second optical signal that is after optical power amplification, and transmit the second NRZ optical signal to the PSR; and the PSR is configured to: receive the first NRZ optical signal input by the first EA modulator, receive the second NRZ optical signal input by the second EA modulator, multiplex the first NRZ optical signal and the second NRZ optical signal, and output a PAM4 signal.

The PAM4 signal generation apparatus provided in this embodiment of the present disclosure includes the DFB, the two EA modulators, the SOA, the PSR, the direct-current power sources, the two electrical-signal generators, and the two amplitude-limiting amplifiers. The two electrical-signal generators and the two amplitude-limiting amplifiers are used to generate the two NRZ electrical signals, the DFB outputs the two optical signals, the SOA amplifies an optical power of one of the optical signals, the two EA modulators may generate the two NRZ optical signals by separately using the NRZ electrical signals and the optical signals including "a large signal and a small signal", and finally, the two NRZ optical signals are multiplexed by the PSR to generate a PAM4 electrical signal. According to this apparatus, a linearity requirement is greatly lowered. The DFB, the two EA modulators, and the SOA are used, implementing a high-linearity PAM4 code. PAM4 modulation is performed in an optical domain, and this prevents a PAM4 signal from being generated on an electrical signal. In this way, an amplitude-limiting device may continue to be used, with no need to use an expensive linear electrical device, to modulate the electrical signal to the optical domain in a distortionless way. Therefore, a high-quality PAM4 signal can be generated in this embodiment of the present disclosure.

With reference to the first aspect, in a first possible implementation of the first aspect, the first electrical-signal generator is configured to pre-compensate the first NRZ electrical signal according to a relative delay that is between the first NRZ electrical signal and the second NRZ electrical signal and that is on a transmission optical path. In an actual application, if a transmission time delay occurs, on a transmission optical path, on the two NRZ optical signals generated by the first EA modulator and the second EA modulator, that is, a skew is generated between the two NRZ optical signals, the skew between the two NRZ optical signals may be pre-compensated on the NRZ electrical signals. Therefore, an optical path compensation unit is not required on the optical path; in this case, a device design is further simplified, and optical path compensation does not need to be performed dedicatedly.

With reference to the first aspect, in a second possible implementation of the first aspect, the second electrical-signal generator is configured to pre-compensate the second NRZ electrical signal according to a relative delay that is between the second NRZ electrical signal and the first NRZ electrical signal and that is on a transmission optical path. In an actual application, if a transmission time delay occurs, on a transmission optical path, on the two NRZ optical signals generated by the first EA modulator and the second EA modulator, that is, a skew is generated between the two NRZ optical signals, the skew between the two NRZ optical signals may be pre-compensated on the NRZ electrical signals. Therefore, an optical path compensation unit is not required on the optical path; in this case, a device design is further simplified, and optical path compensation does not need to be performed dedicatedly.

With reference to the first aspect, in a third possible implementation of the first aspect, a current value of the first direct-current bias signal is less than a current value of the second direct-current bias signal. In an actual application, direct-current bias signals required by the DFB and the SOA are different. The first direct-current bias signal is set as required by the DFB during optical signal generation, and the second direct-current bias signal is set as required by the SOA. Generally, a bias current value required by the DFB during work is less than a bias current value required by the SOA during work.

With reference to the first aspect, in a fourth possible implementation of the first aspect, an optical power of the first optical signal is equal to the optical power of the second optical signal. The DFB may generate two optical signals, which are the first optical signal and the second optical signal respectively. Because the two optical signals are output by a same DFB, the two optical signals have an exactly same wavelength, and the optical powers of the two optical signals may also be exactly the same.

With reference to the first aspect, in a fifth possible implementation of the first aspect, the SOA is specifically configured to amplify the optical power of the second optical signal according to an optical power of the first optical signal to obtain the second optical signal that is after optical power amplification, where an optical power of the second optical signal that is after optical power amplification is twice the optical power of the first optical signal. If the optical power of the first optical signal is equal to the optical power of the second optical signal, the SOA amplifies the optical power of the second optical signal doubly, to obtain the second optical signal that is after optical power amplification. The optical power of the second optical signal that is after optical power amplification is twice the optical power of the first optical signal. After the optical power of the second optical signal is amplified to twice that of the first optical signal, the first optical signal and the second optical signal are modulated by the first EA modulator and the second EA modulator respectively, and an optical power of the second NRZ optical signal is twice an optical power of the first NRZ optical signal, so as to meet a signal amplitude requirement of the PAM4 signal.

With reference to the fifth possible implementation of the first aspect, in a sixth possible implementation of the first aspect, the optical power of the second NRZ optical signal generated by the second EA modulator is twice the optical power of the first NRZ optical signal generated by the first EA modulator. The optical power of the second optical signal that is after optical power amplification is twice the optical power of the first optical signal. After the optical power of the second optical signal is amplified to twice that of the first optical signal, the first optical signal and the second optical signal are modulated by the first EA modulator and the second EA modulator respectively, and the optical power of the second NRZ optical signal is twice the optical power of the first NRZ optical signal, so as to meet the signal amplitude requirement of the PAM4 signal.

With reference to the first aspect, or the first, second, third, fourth, fifth, or sixth possible implementation of the first aspect, in a seventh possible implementation of the first aspect, the DFB is specifically configured to: adjust a reflection coefficient of a first end surface, adjust a reflection coefficient of a second end surface, generate the first optical signal by using the first end surface, and generate the second optical signal by using the second end surface. The DFB needs to adjust both the reflection coefficient of the first end surface and the reflection coefficient of the second end surface when generating the two optical signals. The reflection coefficient of the two end surfaces of the DFB are adjusted to make output optical powers of the two output ports be the same.

With reference to the first aspect, or the first, second, third, fourth, fifth, or sixth possible implementation of the first aspect, in an eighth possible implementation of the first aspect, the first electrical-signal generator is specifically a first digital signal processor DSP; and the second electrical-signal generator is specifically a second DSP. Specifically, the DSPs may be used to generate the NRZ electrical signals. A DSP may be selected according to an actual scenario to generate an NRZ electrical signal.

With reference to the first aspect, or the first, second, third, fourth, fifth, or sixth possible implementation of the first aspect, in a ninth possible implementation of the first aspect, the DFB is specifically configured to: transmit the first optical signal to the first EA modulator by using a first passive optical waveguide, and transmit the second optical signal to the SOA by using a second passive optical waveguide. Specifically, in this embodiment of the present disclosure, the DFB is configured to: generate two optical signals from a same source, use the passive optical waveguides to separate the two optical signals, guide the two optical signals into the first EA modulator and the SOA respectively, and output the modulated optical signals from the two ports of the DFB respectively.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person skilled in the art may still derive other drawings from these accompanying drawings.

DESCRIPTION OF EMBODIMENTS

The embodiments of the present disclosure provide a PAM4 signal generation apparatus, to generate a high-quality PAM4 signal.

The following describes the embodiments of the present disclosure with reference to accompanying drawings.

In the specification, claims, and accompanying drawings of the present disclosure, the terms "first", "second", and so on are intended to distinguish between similar objects, but do not necessarily indicate a specific order or sequence. It should be understood that the terms used in such a way are interchangeable in proper circumstances, which is merely a discrimination manner that is used when objects having a same attribute are described in the embodiments of the present disclosure. In addition, the terms "include", "contain" and any other variants mean to cover the non-exclusive inclusion, so that a process, method, system, product, or device that includes a series of units is not necessarily limited to those units, but may include other units not expressly listed or inherent to such a process, method, system, product, or device.

The following separately provides descriptions in detail.

The PAM4 signal generation apparatus provided in this embodiment of the present disclosure can generate a PAM4 optical signal in an optical domain. As shown in Table 1, a principle of generating a PAM4 signal by using two NRZ signals is listed.

TABLE 1

| Corresponding combinations for generating a PAM4 signal | | |
|---|---|---|
| NRZ1 (least significant bit) | NRZ2 (most significant bit) | PAM4 |
| 0 | 0 | 0 |
| 1 | 0 | 1 |
| 0 | 1 | 2 |
| 1 | 1 | 3 |

When the least-significant-bit NRZ output signal is 0, and the most-significant-bit NRZ output signal is also 0, an obtained PAM4 signal is 0. If the least-significant-bit NRZ signal changes to 1, and the most-significant-bit NRZ signal is maintained to be 0, an obtained PAM4 signal is 1. If the least-significant-bit NRZ output signal is 0, and the most-significant-bit NRZ output signal is 1, a PAM4 signal at a third level is obtained. If both the least-significant-bit NRZ signal and the most-significant-bit NRZ signal are output as 1, a PAM4 signal at a fourth level is obtained. It should be noted that the foregoing table describes only a specific embodiment of changing an NRZ signal into a PAM4 signal. What is unlimited is that a Gray encoding manner may also be used to implement mapping from an NRZ signal to a PAM4 signal in this embodiment of the present disclosure. For example, when the least-significant-bit NRZ signal is 0, and the most-significant-bit NRZ signal is 0, a generated PAM4 signal is 0; when the least-significant-bit NRZ signal is 1, and the most-significant-bit NRZ signal is 0, a generated PAM4 signal is 1; when the least-significant-bit NRZ signal is 0, and the most-significant-bit NRZ signal is 1, a generated PAM4 signal is 2; when the least-significant-bit NRZ signal is 1, and the most-significant-bit NRZ signal is 1, a generated PAM4 signal is 3.

Figure 1:
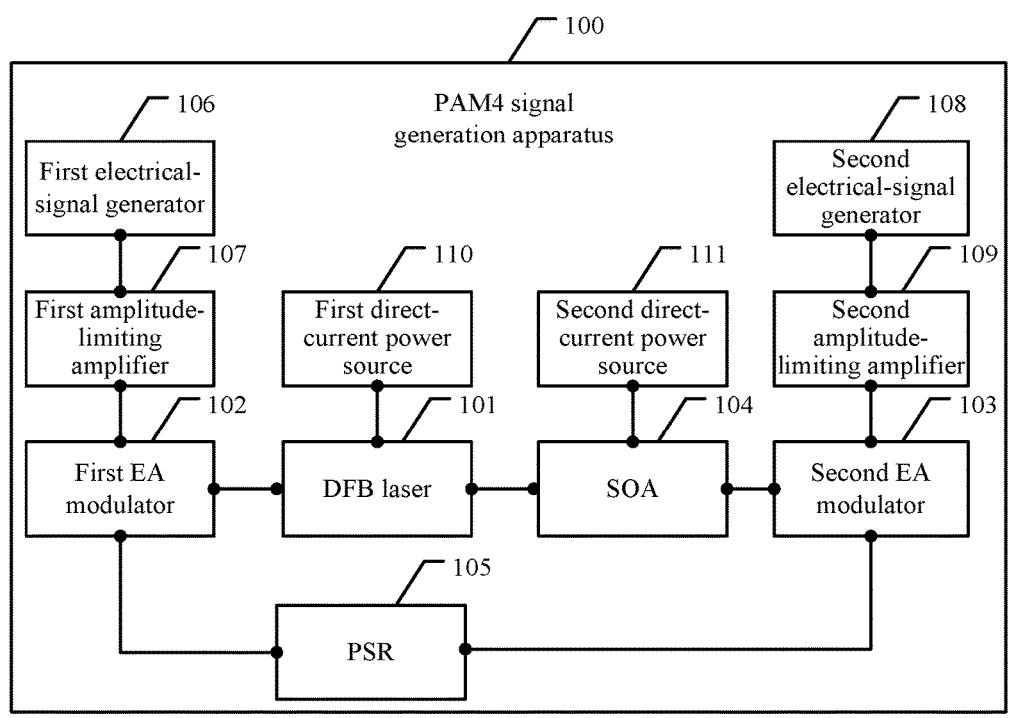
FIG. 1 is a schematic structural composition diagram of a PAM4 signal generation apparatus according to an embodiment of the present disclosure.

In an embodiment of the PAM4 signal generation apparatus of the present disclosure, a high-quality PAM4 signal may be generated after a single-ended EML is improved into a two-ended EML. Referring to FIG. 1, a PAM4 signal generation apparatus 100 provided in an embodiment of the present disclosure includes a distributed feedback laser (DFB) 101, a first electro-absorption (EA) modulator 102, a second EA modulator 103, a semiconductor optical amplifier (SOA) 104, a polarization beam splitting rotator (PSR) 105, a first electrical-signal generator 106, a first amplitude-limiting amplifier 107, a second electrical-signal generator 108, a second amplitude-limiting amplifier 109, a first direct-current power source 110, and a second direct-current power source 111. FIG. 1 shows a structural relationship between all components of the PAM4 signal generation apparatus 100 in this embodiment of the present disclosure.

An input port of the DFB 101 is connected to the first direct-current power source 110, and the DFB 101 is connected to both the first EA modulator 102 and the SOA 104 by using two output ports.

The first EA modulator 102 is connected to both the first amplitude-limiting amplifier 107 and the DFB 101 by using two input ports, and an output port of the first EA modulator 102 is connected to the PSR 105.

The SOA 104 is connected to both the DFB 101 and the second direct-current power source 111 by using two input ports, and an output port of the SOA 104 is connected to the second EA modulator 103.

The second EA modulator 103 is connected to both the second amplitude-limiting amplifier 109 and the SOA 104 by using two input ports, and an output port of the second EA modulator 103 is connected to the PSR 105.

The PSR 105 is connected to both the first EA modulator 102 and the second EA modulator 103 by using two input ports.

The first electrical-signal generator 106 is connected to the first amplitude-limiting amplifier 107, and the second electrical-signal generator 108 is connected to the second amplitude-limiting amplifier 109.

The PAM4 signal generation apparatus provided in this embodiment of the present disclosure includes the DFB, the two EA modulators, the SOA, the PSR, the direct-current power sources, the two electrical-signal generators, and the two amplitude-limiting amplifiers. The two EA modulators may generate two NRZ optical signals with different amplitudes by using the DFB and the SOA, and the PSR may multiplex the two NRZ optical signals with different amplitudes, to generate a PAM4 signal. The following describes a process of generating the PAM4 signal in the PAM4 signal generation apparatus shown in FIG. 1. Functions of all components of the PAM4 signal generation apparatus are as follows:

The DFB is configured to: receive a first direct-current bias signal input by the first direct-current power source, generate a first optical signal and a second optical signal according to the first direct-current bias signal separately, transmit the first optical signal to the first EA modulator, and transmit the second optical signal to the SOA, where the first optical signal and the second optical signal have a same wavelength.

The first EA modulator is configured to: receive a first NRZ electrical signal input by the first electrical-signal generator by using the first amplitude-limiting amplifier, receive the first optical signal input by the DFB, obtain a first NRZ optical signal by means of modulation according to the first NRZ electrical signal and the first optical signal, and transmit the first NRZ optical signal to the PSR.

The SOA is configured to: receive a second direct-current bias signal input by the second direct-current power source, receive the second optical signal input by the DFB, adjust an optical power of the second optical signal according to the second direct-current bias signal to obtain a second optical signal that is after optical power amplification, and transmit, to the second EA modulator, the second optical signal that is after optical power amplification.

The second EA modulator is configured to: receive a second NRZ electrical signal input by the second electrical-signal generator by using the second amplitude-limiting amplifier, receive the second optical signal that is after optical power amplification and that is input by the SOA, obtain a second NRZ optical signal by means of modulation according to the second NRZ electrical signal and the second optical signal that is after optical power amplification, and transmit the second NRZ optical signal to the PSR.

The PSR is configured to: receive the first NRZ optical signal input by the first EA modulator, receive the second NRZ optical signal input by the second EA modulator, multiplex the first NRZ optical signal and the second NRZ optical signal, and output the PAM4 signal.

In this embodiment of the present disclosure, the DFB may generate two optical signals. The optical signals are original optical signals before being modulated by the EAs. The DFB is connected to the first direct-current power source. The first direct-current power source generates the first direct-current bias signal (that is, the first BIAS), and inputs the first direct-current bias signal to the DFB. Triggered by the first direct-current bias signal, the DFB generates the two optical signals separately. The two output ports of the DFB are connected to the first EA modulator and the SOA respectively, and the two optical signals generated by the DFB are sent to the first EA modulator and the SOA respectively.

In this embodiment of the present disclosure, the first EA modulator is connected to the first amplitude-limiting amplifier, the first amplitude-limiting amplifier is connected to the first electrical-signal generator, the first electrical-signal generator generates the first NRZ electrical signal, and the first NRZ electrical signal is input to the first EA modulator after undergoing amplitude-limiting amplification performed by the first amplitude-limiting amplifier. The first amplitude-limiting amplifier is specifically configured to: receive an input signal that presents a binary data stream, to perform amplification for the input signal with a high gain to a saturated state, and output a substantive second-order output signal that presents a binary data stream. The first amplitude-limiting amplifier has a high-gain function, so that the first amplitude-limiting amplifier can amplify an input signal to the saturated state. In addition, the first amplitude-limiting amplifier has an enough speed to keep pace with a quickly changed input signal. The first EA modulator obtains the first NRZ optical signal by means of modulation according to the first NRZ electrical signal and the first optical signal. The first EA modulator is an optical signal modulation device produced by using an exciton absorption effect in a semiconductor, and is characterized by a high response speed and low power consumption. The first EA modulator may be configured to perform signal modulation and coding in high-speed fiber-optic communication. After generating the first NRZ optical signal, the first EA modulator transmits the first NRZ optical signal to the PSR.

In this embodiment of the present disclosure, the SOA is connected to the second direct-current power source and the DFB, and the second direct-current power source generates the second direct-current bias signal (that is, the second BIAS), and inputs the second direct-current bias signal to the SOA. A function of the SOA is to perform amplification for an optical signal. An amplification circuit of the SOA can work only based on a direct-current bias. The second direct-current power source may provide the second direct-current bias signal for the SOA. The SOA is used to perform amplification for the to-be-transmitted signal. In this way, amplification can be directly performed for an optical signal without optical-to-electrical conversion or electrical-to-optical conversion. The SOA amplifies the optical power of the second optical signal input by the DFB, so as to obtain the second optical signal whose optical power is twice that of the first optical signal. In this case, the two EA modulators can generate two NRZ optical signals with different amplitudes.

In this embodiment of the present disclosure, the second EA modulator is connected to the second amplitude-limiting amplifier, the second amplitude-limiting amplifier is connected to the second electrical-signal generator, the second electrical-signal generator generates the second NRZ electrical signal, and the second NRZ electrical signal is input to the second EA modulator after undergoing amplitude-limiting amplification performed by the second amplitude-limiting amplifier. The second amplitude-limiting amplifier is specifically configured to: receive an input signal that presents a binary data stream, to perform amplification for the input signal with a high gain to a saturated state, and output a substantive second-order output signal that presents a binary data stream. The second amplitude-limiting amplifier has a high-gain function, so that the second amplitude-limiting amplifier can amplify an input signal to the saturated state. In addition, the second amplitude-limiting amplifier has an enough speed to keep pace with a quickly changed input signal. The second EA modulator obtains the second NRZ optical signal by means of modulation according to the second NRZ electrical signal and the second optical signal. The second EA modulator is an optical signal modulation device produced by using an exciton absorption effect in a semiconductor, and is characterized by a high response speed and low power consumption. The second EA modulator may be configured to perform signal modulation and coding in high-speed fiber-optic communication. After generating the second NRZ optical signal, the second EA modulator transmits the second NRZ optical signal to the PSR.

In this embodiment of the present disclosure, the PSR has a multiplexing function. The PSR receives the first NRZ optical signal input by the first EA modulator and receives the second NRZ optical signal input by the second EA modulator. The PSR multiplexes the first NRZ optical signal and the second NRZ optical signal to generate the PAM4 signal, and then the PSR outputs the generated PAM4 signal.

In some embodiments of the present disclosure, the first electrical-signal generator is configured to pre-compensate the first NRZ electrical signal according to a relative delay that is between the first NRZ electrical signal and the second NRZ electrical signal and that is on a transmission optical path.

Specifically, in an actual application, if a transmission time delay occurs, on a transmission optical path, on the two NRZ optical signals generated by the first EA modulator and the second EA modulator, that is, a skew is generated between the two NRZ optical signals, for example, there is a delay of 10 picoseconds that is between the two NRZ optical signals and that is on the transmission optical path, the skew between the two NRZ optical signals may be pre-compensated on the NRZ electrical signals. Therefore, an optical path compensation unit is not required on the optical path; in this case, a device design is further simplified, optical path compensation does not need to be performed dedicatedly, and signal modulation is more flexible. In some embodiments of the present disclosure, the first electrical-signal generator may perform pre-compensation when generating the first NRZ electrical signal, so as to eliminate the relative delay that is between the two NRZ electrical signals and that is on the transmission optical path, that is, the skew between the two NRZ electrical signals may be eliminated. The first electrical-signal generator performs pre-compensation, so that the first electrical-signal generator can eliminate the relative delay between the first NRZ electrical signal and the second NRZ electrical signal when obtaining the first NRZ electrical signal by means of modulation.

In some other embodiments of the present disclosure, the second electrical-signal generator is configured to pre-compensate the second NRZ electrical signal according to a relative delay that is between the second NRZ electrical signal and the first NRZ electrical signal and that is on a transmission optical path.

Specifically, in an actual application, if a transmission time delay occurs, on a transmission optical path, on the two NRZ optical signals generated by the first EA modulator and the second EA modulator, that is, a skew is generated between the two NRZ optical signals, for example, there is a delay of 10 picoseconds that is between the two NRZ optical signals and that is on the transmission optical path, the skew between the two NRZ optical signals may be pre-compensated on the NRZ electrical signals. Therefore, an optical path compensation unit is not required on the optical path; in this case, a device design is further simplified, optical path compensation does not need to be performed dedicatedly, and signal modulation is more flexible. In some embodiments of the present disclosure, the second electrical-signal generator may perform pre-compensation when generating the second NRZ electrical signal, so as to eliminate the relative delay that is between the two NRZ electrical signals and that is on the transmission optical path, that is, the skew between the two NRZ electrical signals may be eliminated. The second electrical-signal generator performs pre-compensation, so that the second electrical-signal generator can eliminate the relative delay between the second NRZ electrical signal and the first NRZ electrical signal when obtaining the second NRZ electrical signal by means of modulation.

In some embodiments of the present disclosure, a current value of the first direct-current bias signal is less than a current value of the second direct-current bias signal. The first direct-current power source is connected to the DFB, and the second direct-current power source may be connected to the SOA. To meet working requirements of the DFB and the SOA, the first direct-current power source may generate the first direct-current bias signal, and the second direct-current power source generates the second direct-current bias signal. For example, the current value of the first direct-current bias signal generated by the first direct-current power source may range from 70 milliamperes to 100 milliamperes, and the current value of the second direct-current bias signal generated by the second direct-current power source may range from 70 milliamperes to 100 milliamperes. In an actual application, direct-current bias signals required by the DFB and the SOA are different. The first direct-current bias signal is set as required by the DFB during optical signal generation, and the second direct-current bias signal is set as required by the SOA.

In some embodiments of the present disclosure, an optical power of the first optical signal is equal to the optical power of the second optical signal. The DFB may generate two optical signals, which are the first optical signal and the second optical signal respectively. Because lasers are output by a same DFB, the two optical signals have an exactly same wavelength, and the optical powers of the two optical signals may also be exactly the same. It should be noted that because the SOA is further connected to the DFB, and the SOA may amplify the optical power of the second optical signal, the optical power of the first optical signal and the optical power of the second optical signal may be unequal. This specifically depends on a manner of generating an optical signal by the DFS in a different application scenario.

In some embodiments of the present disclosure, the SOA is specifically configured to amplify the optical power of the second optical signal according to an optical power of the first optical signal to obtain the second optical signal that is after optical power amplification, where an optical power of the second optical signal that is after optical power amplification is twice the optical power of the first optical signal.

Further, in some embodiments of the present disclosure, an optical power of the second NRZ optical signal generated by the second EA modulator is twice an optical power of the first NRZ optical signal generated by the first EA modulator.

If the optical power of the first optical signal is equal to the optical power of the second optical signal, the SOA amplifies the optical power of the second optical signal doubly, to obtain the second optical signal that is after optical power amplification. The optical power of the second optical signal that is after optical power amplification is twice the optical power of the first optical signal. If the optical power of the first optical signal is unequal to the optical power of the second optical signal, the SOA amplifies the optical power of the second optical signal according to the optical power of the first optical signal to obtain the second optical signal that is after optical power amplification. The optical power of the second optical signal that is after optical power amplification is twice the optical power of the first optical signal. After the optical power of the second optical signal is amplified to twice that of the first optical signal, the first optical signal and the second optical signal are modulated by the first EA modulator and the second EA modulator respectively, and the optical power of the second NRZ optical signal is twice the optical power of the first NRZ optical signal, so as to meet a signal amplitude requirement of the PAM4 signal.

In some embodiments of the present disclosure, an input port of the DFB is connected to the first direct-current power source, and an input port of the SOA is connected to the second direct-current power source. It should be noted that, in this embodiment of the present disclosure, the first direct-current bias signal and the second direct-current bias signal may be generated by different direct-current power sources. For example, the first direct-current power source generates the first direct-current bias signal, and the second direct-current power source generates the second direct-current bias signal.

In some embodiments of the present disclosure, the DFB is specifically configured to: adjust a reflection coefficient of a first end surface, adjust a reflection coefficient of a second end surface, generate the first optical signal by using the first end surface, and generate the second optical signal by using the second end surface. The DFB needs to adjust both the reflection coefficient of the first end surface and the reflection coefficient of the second end surface when generating the two optical signals. The reflection coefficient of the two end surfaces of the DFB are adjusted to make output optical powers of the two output ports be the same.

In some embodiments of the present disclosure, the first electrical-signal generator is specifically a first digital signal processor (DSP), and the second electrical-signal generator is specifically a second DSP. Specifically, the DSPs may be used to generate the NRZ electrical signals. A DSP may be selected according to an actual scenario to generate an NRZ electrical signal.

In some embodiments of the present disclosure, the DFB is specifically configured to: transmit the first optical signal to the first EA modulator by using a first passive optical waveguide, and transmit the second optical signal to the SOA by using a second passive optical waveguide.

Specifically, in this embodiment of the present disclosure, the DFS is configured to: generate two optical signals from a same source, use the passive optical waveguides to separate the two optical signals, guide the two optical signals into the first EA modulator and the SOA respectively, and output the modulated optical signals from the two ports of the DFB respectively.

It can be learned, from descriptions of the example of the present disclosure in the foregoing embodiment, that the PAM4 signal generation apparatus provided in this embodiment of the present disclosure includes the DFB, the two EA modulators, the SOA, the PSR, the direct-current power sources, the two electrical-signal generators, and the two amplitude-limiting amplifiers. The two electrical-signal generators and the two amplitude-limiting amplifiers are used to generate the two NRZ electrical signals, the DFB outputs the two optical signals, the SOA amplifies an optical power of one of the optical signals, the two EA modulators may generate the two NRZ optical signals by separately using the NRZ electrical signals and the optical signals including "a large signal and a small signal", and finally, the two NRZ optical signals are multiplexed by the PSR to generate a PAM4 electrical signal. According to this apparatus, a linearity requirement is greatly lowered. The DFB, the two EA modulators, and the SOA are used, implementing a high-linearity PAM4 code. PAM4 modulation is performed in an optical domain, and this prevents a PAM4 signal from being generated on an electrical signal. In this way, an amplitude-limiting device may continue to be used, with no need to use an expensive linear electrical device, to modulate the electrical signal to the optical domain in a distortionless way. Therefore, a high-quality PAM4 signal can be generated in this embodiment of the present disclosure.

For better understanding and implementation of the foregoing solutions in the embodiments of the present disclosure, the following gives detailed descriptions by using a corresponding application scenario as an example.

In a prior-art technical solution, a single-ended EML or a single-ended DML device is used, an NRZ signal may be obtained by means of modulation, an optical signal cannot be directly modulated into a PAM4 signal within the device, the single-ended EML cannot generate a PAM4 signal of relatively high quality due to a linearity limitation, and the single-ended DML device cannot generate a PAM4 signal of relatively high quality either due to impact of characteristics of high and low temperatures and a noise characteristic that are of the single-ended DML device.

Figure 2:
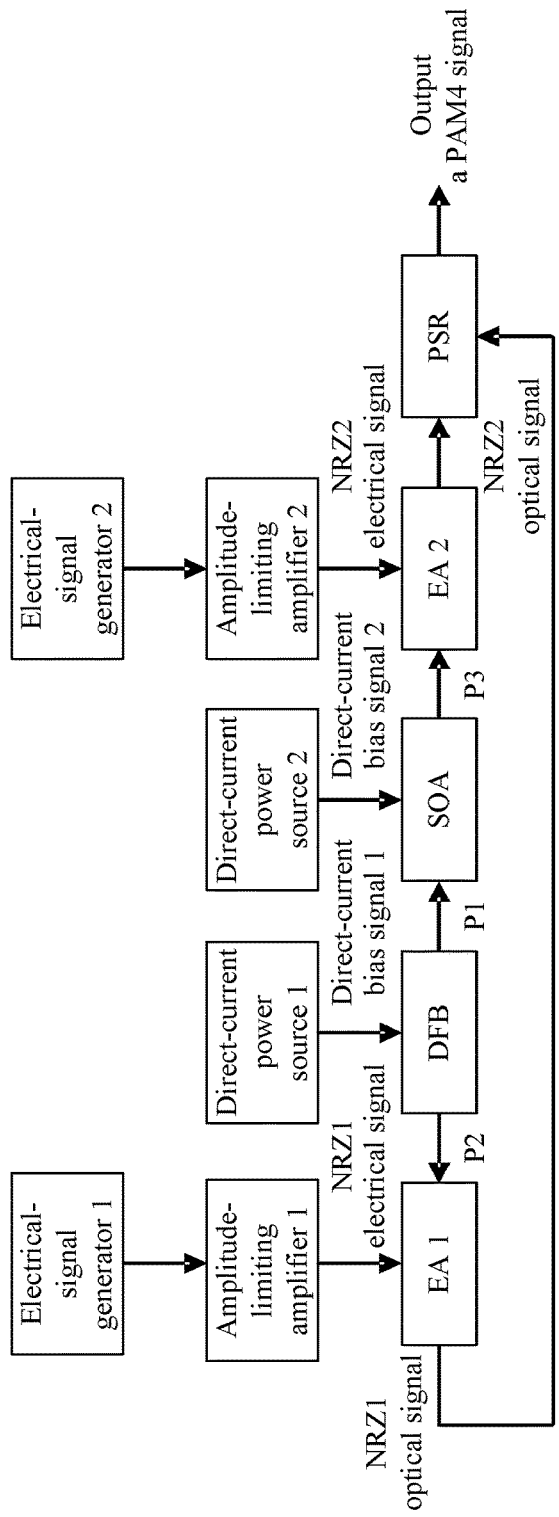
FIG. 2 is a schematic flowchart of generating a PAM4 signal in a PAM4 signal generation apparatus according to an embodiment of the present disclosure.

Referring to FIG. 2, FIG. 2 is a schematic flowchart of generating a PAM4 signal in a PAM4 signal generation apparatus. The PAM4 signal generation apparatus provided in this embodiment of the present disclosure includes a DFB, two EA modulators (for example, an EA 1 and an EA 2), an SOA, a PSR, two direct-current power sources (for example, a direct-current power source 1 and a direct-current power source 2), two electrical-signal generators (for example, an electrical-signal generator 1 and an electrical-signal generator 2), and two amplitude-limiting amplifiers (for example, an amplitude-limiting amplifier 1 and an amplitude-limiting amplifier 2). In this embodiment of the present disclosure, a PAM4 signal is generated by using the foregoing integrated device.

A process of generating a PAM4 optical signal is as follows: The direct-current power source 1 generates a direct-current bias signal 1, the direct-current bias signal 1 is input to the DFB, the direct-current power source 2 generates a direct-current bias signal 2, and the direct-current bias signal 2 is input the SOA. Reflection coefficients of two ports of the DFB are adjusted, so that output optical powers of continuous-wave light on the two output ports are the same, and an optical signal P1 and an optical signal P2 are generated. In a structure in which a first electro-absorption modulator (that is, the EA 1) is on the left of the DFB, the optical signal P2 is driven by using an NRZ1 electrical signal, and a first NRZ optical signal (that is, the NRZ1 optical signal) is generated according to the optical signal P2 and is recorded as NRZ1_out. A structure in which a semiconductor optical amplifier is on the right of the DFB has a main function of adjusting an output amplitude. Optimization is performed by using the direct-current bias signal 2, an optical signal P3 is generated after amplification is performed for the optical signal P1, and the optical signal P3 is injected into a second electro-absorption modulator (that is, the EA 2) of the integrated device, and then is driven by using an NRZ electrical signal to generate a second NRZ optical signal that is recorded as NRZ2_out. The two NRZ optical signals may be combined in a PSR to form a complete PAM4 signal. A skew between the two NRZ optical signals may be pre-compensated on the NRZ electrical signals. Therefore, an optical path compensation unit is not required on an optical path; in this case, a device design is further simplified, optical path compensation does not need to be performed dedicatedly, and signal modulation is more flexible.

The PAM4 signal obtained based on the foregoing method is not limited by device linearity. On the contrary, because the two electro-absorption modulators both perform NRZ modulation, and work in curve modulation saturation and cut-off areas, the solution proposed in this embodiment of the present disclosure imposes no special requirement on the device linearity provided that a low-cost amplitude limiting device is used. This is conducive to increasing an entire yield of the device.

As shown in FIG. 2, the optical signals output from two ends of the DFB are P1 and P2. Because the optical signals are output from a same laser, the optical signals have an exactly same wavelength, and may have an exactly same power, that is, P=P1=P2. The direct-current optical signal P2 is output from a left end of the DFB, passes through the electro-absorption modulator EA1, and then is modulated into the NRZ optical signal. It should be noted that because the NRZ optical signal is modulated by the EA1, a corresponding electronic driver is an amplitude-limiting amplifier. The direct-current optical signal P1 is output from a right end of the DFB, and passes through a gain amplifying area of the SOA before being modulated. In this case, the direct-current optical signal $P3=2 \times P1$, and an NRZ electrical signal is loaded after the direct-current optical signal P3 passes through the EA 2. Because of gain amplification of the SOA, an amplitude of the NRZ2 optical signal output by the EA 2 is twice that of the NRZ1 optical signal. That is, the amplitude of the NRZ2 optical signal=2×the amplitude of the NRZ1 optical signal. The two NRZ optical signals form a PAM4 signal after being multiplexed by the PSR. As shown in Table 1, four levels of the PAM4 signal are obtained by four different combinations of the two NRZ optical signals.

An embodiment of the present disclosure provides a new PAM4 signal generation apparatus that uses a PAM4 signal generation method based on two NRZ optical signals. An existing single-ended EML is improved, and an electro-absorption modulator and an active gain area are added to two sides of a DFB to generate a PAM4 signal. A device linearity requirement of the PAM4 signal generation apparatus provided in this embodiment of the present disclosure is greatly lowered, and a structure of the DFB plus double EAs plus the SOA implements a high-linearity PAM4 code. The PAM4 signal generation apparatus in this embodiment of the present disclosure may be based on an existing InP technology, has a same package procedure as an indium phosphide (InP) laser/a semiconductor optical amplifier, does not require a new technological process, and is completely compatible with the existing technology, reducing device costs. This embodiment of the present disclosure may be conducive to reducing device difficulty. Because PAM4 modulation is performed on direct-current optical signal, no PAM4 signal needs to be used on an electrical signal. In this way, a prior-art amplitude-limiting device can continue to be used, and no linear electrical device needs to be used.

It should be noted that the described apparatus embodiment is merely an example. The units described as separate parts may or may not be physically separate, and parts displayed as units may or may not be physical units, may be located in one position, or may be distributed on a plurality of network units. Some or all the modules may be selected according to actual needs to achieve the objectives of the solutions of the embodiments. In addition, in the accompanying drawings of the apparatus embodiments provided in the present disclosure, connection relationships between modules indicate that the modules have communication connections with each other, and may be specifically implemented as one or more communications buses or signal cables or optical fibers.

Based on the foregoing descriptions of the implementations, a person skilled in the art may clearly understand that the present disclosure may be implemented by necessary universal hardware or by dedicated hardware including a dedicated integrated circuit, a dedicated CPU, a dedicated memory, a dedicated component, and the like. A specific hardware structure used to implement a same function may also be diversified, for example, an analog circuit, a digital circuit, or a dedicated circuit.

What is claimed is:

1. An apparatus, comprising:
a distributed feedback laser (DFB),
a first electro-absorption (EA) modulator,
a second EA modulator,
a semiconductor optical amplifier (SOA),
a polarization beam splitting rotator (PSR),
a first electrical-signal generator,
a first amplitude-limiting amplifier,
a second electrical-signal generator,
a second amplitude-limiting amplifier,
a first direct-current power source, and
a second direct-current power source;
wherein:
an input port of the DFB is connected to the first direct-current power source, and the DFB is connected to both the first EA modulator and the SOA by using two output ports;
the first EA modulator is connected to both the first amplitude-limiting amplifier and the DFB by using two input ports, and an output port of the first EA modulator is connected to the PSR;
the SOA is connected to both the DFB and the second direct-current power source by using two input ports, and an output port of the SOA is connected to the second EA modulator;
the second EA modulator is connected to both the second amplitude-limiting amplifier and the SOA by using two input ports, and an output port of the second EA modulator is connected to the PSR;
the PSR is connected to both the first EA modulator and the second EA modulator by using two input ports;
the first electrical-signal generator is connected to the first amplitude-limiting amplifier, and the second electrical-signal generator is connected to the second amplitude-limiting amplifier;
the DFB is configured to: receive a first direct-current bias signal input by the first direct-current power source, generate a first optical signal and a second optical signal according to the first direct-current bias signal separately, transmit the first optical signal to the first EA modulator, and transmit the second optical signal to the SOA, wherein the first optical signal and the second optical signal have a same wavelength;
the first EA modulator is configured to: receive a first non-return-to-zero (NRZ) electrical signal input by the first electrical-signal generator by using the first amplitude-limiting amplifier, receive the first optical signal input by the DFB, obtain a first NRZ optical signal by means of modulation according to the first NRZ electrical signal and the first optical signal, and transmit the first NRZ optical signal to the PSR;
the SOA is configured to: receive a second direct-current bias signal input by the second direct-current power source, receive the second optical signal input by the DFB, adjust an optical power of the second optical signal according to the second direct-current bias signal to obtain a second optical signal that is after optical power amplification, and transmit, to the second EA modulator, the second optical signal that is after optical power amplification;
the second EA modulator is configured to: receive a second NRZ electrical signal input by the second electrical-signal generator by using the second amplitude-limiting amplifier, receive the second optical signal that is after optical power amplification and that is input by the SOA, obtain a second NRZ optical signal by means of modulation according to the second NRZ electrical signal and the second optical signal that is after optical power amplification, and transmit the second NRZ optical signal to the PSR; and
the PSR is configured to: receive the first NRZ optical signal input by the first EA modulator, receive the second NRZ optical signal input by the second EA modulator, multiplex the first NRZ optical signal and the second NRZ optical signal to obtain an output signal, and output the output signal.

2. The apparatus according to claim 1, wherein the first electrical-signal generator is configured to pre-compensate the first NRZ electrical signal according to a relative delay that is between the first NRZ electrical signal and the second NRZ electrical signal and that is on a transmission optical path.

3. The apparatus according to claim 1, wherein the second electrical-signal generator is configured to pre-compensate the second NRZ electrical signal according to a relative delay that is between the second NRZ electrical signal and the first NRZ electrical signal and that is on a transmission optical path.

4. The apparatus according to claim 1, wherein a current value of the first direct-current bias signal is less than a current value of the second direct-current bias signal.

5. The apparatus according to claim 1, wherein an optical power of the first optical signal is equal to the optical power of the second optical signal.

6. The apparatus according to claim 1, wherein the SOA is configured to amplify the optical power of the second optical signal according to an optical power of the first optical signal to obtain the second optical signal that is after optical power amplification, wherein an optical power of the second optical signal that is after optical power amplification is twice the optical power of the first optical signal.

7. The apparatus according to claim 1, wherein the DFB is configured to: adjust a reflection coefficient of a first end surface, adjust a reflection coefficient of a second end surface, generate the first optical signal by using the first end surface, and generate the second optical signal by using the second end surface.

8. The apparatus according to claim 1, wherein the first electrical-signal generator is specifically a first digital signal processor (DSP); and
the second electrical-signal generator is a second DSP.

9. The apparatus according to claim 1, wherein the DFB is configured to: transmit the first optical signal to the first EA modulator by using a first passive optical waveguide, and transmit the second optical signal to the SOA by using a second passive optical waveguide.

10. The apparatus according to claim 1, wherein the apparatus comprises a four-level pulse amplitude modulation (PAM4) signal generation apparatus.

11. The apparatus according to claim 6, wherein an optical power of the second NRZ optical signal generated by the second EA modulator is twice an optical power of the first NRZ optical signal generated by the first EA modulator.

12. The apparatus according to claim 10, wherein the output signal is a PAM4 signal.

* * * * *